United States Patent
Twede et al.

(10) Patent No.: US 9,432,587 B1
(45) Date of Patent: Aug. 30, 2016

(54) NEAR-FIELD ENHANCED PHOTON CONVERSION

(71) Applicant: Lockheed Martin Corporation, Bethesda, MD (US)

(72) Inventors: David R. Twede, Orlando, FL (US); Matthew G. Comstock, Orlando, FL (US); Clara R. Baleine, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 116 days.

(21) Appl. No.: 14/100,497

(22) Filed: Dec. 9, 2013

Related U.S. Application Data

(63) Continuation-in-part of application No. 13/891,692, filed on May 10, 2013.

(60) Provisional application No. 61/645,514, filed on May 10, 2012.

(51) Int. Cl.
*G01J 3/28* (2006.01)
*H04N 5/235* (2006.01)

(52) U.S. Cl.
CPC .................................... *H04N 5/235* (2013.01)

(58) Field of Classification Search
CPC ..................................... G01J 1/04; G01J 3/28
See application file for complete search history.

(56) References Cited

U.S. PATENT DOCUMENTS

| | | | |
|---|---|---|---|
| 4,872,187 A | 10/1989 | Nakahata et al. | |
| 6,292,534 B1 | 9/2001 | Linders et al. | |
| 6,950,492 B2 | 9/2005 | Besson | |
| 6,960,767 B1 | 11/2005 | Do et al. | |
| 7,121,474 B2 | 10/2006 | Bourianoff et al. | |
| 7,477,727 B1 | 1/2009 | Malashanko | |
| 7,532,703 B2 | 5/2009 | Du et al. | |
| 7,804,103 B1 | 9/2010 | Zhai et al. | |
| 7,937,280 B1 | 5/2011 | Leung et al. | |

(Continued)

FOREIGN PATENT DOCUMENTS

WO 2012174173 A2 12/2012

OTHER PUBLICATIONS

Ferrer, Domingo et al., "Atomic structure of three-layer Au/Pd nanoparticles revealed by aberration-corrected scanning transmission electron microscopy," Journal of Materials Chemistry, vol. 18, Mar. 19, 2008, RSCPublishing, 6 pages.

(Continued)

*Primary Examiner* — David Porta
*Assistant Examiner* — Faye Boosalis
(74) *Attorney, Agent, or Firm* — Withrow & Terranova, PLLC

(57) ABSTRACT

A photon conversion assembly. The photon conversion assembly includes a first plurality of photon conversion particles configured to convert photons in a first received band to photons in a first converted band, and a second plurality of photon conversion particles configured to convert photons in a second received band to photons in a second converted band. A first plasmonic near-field enhancement material that enhances an attraction of photons in the first received band is positioned in proximity to at least some of the first plurality of photon conversion particles, and a second plasmonic near-field enhancement material that enhances an attraction of photons in the second received band is positioned in proximity to at least some of the second plurality of photon conversion particles.

19 Claims, 12 Drawing Sheets

(56) References Cited

U.S. PATENT DOCUMENTS

| | | | |
|---|---|---|---|
| 7,972,557 B2* | 7/2011 | Hyde | C02F 1/32 210/748.01 |
| 8,536,532 B1 | 9/2013 | Kross et al. | |
| 9,105,273 B1 | 8/2015 | Twede et al. | |
| 9,110,292 B1 | 8/2015 | Twede et al. | |
| 9,157,872 B1 | 10/2015 | Twede | |
| 2002/0117635 A1 | 8/2002 | Shinada et al. | |
| 2002/0149692 A1 | 10/2002 | Tomita et al. | |
| 2005/0025280 A1 | 2/2005 | Schulte | |
| 2005/0084064 A1 | 4/2005 | McIntyre | |
| 2005/0111017 A1 | 5/2005 | Takahashi et al. | |
| 2006/0054863 A1 | 3/2006 | Dai et al. | |
| 2007/0044559 A1 | 3/2007 | Andrews | |
| 2009/0003514 A1 | 1/2009 | Edic et al. | |
| 2009/0027518 A1 | 1/2009 | Kita | |
| 2009/0059406 A1 | 3/2009 | Powers et al. | |
| 2010/0142062 A1 | 6/2010 | Asami et al. | |
| 2010/0261263 A1 | 10/2010 | Vo-Dinh et al. | |
| 2011/0021970 A1 | 1/2011 | Vo-Dinh et al. | |
| 2011/0129537 A1 | 6/2011 | Vo-Dinh et al. | |
| 2011/0181191 A1 | 7/2011 | Smith et al. | |
| 2011/0222658 A1 | 9/2011 | Radley | |
| 2011/0305318 A1 | 12/2011 | Robinson | |
| 2012/0027175 A1 | 2/2012 | Radley et al. | |
| 2013/0051529 A1 | 2/2013 | Basu et al. | |
| 2013/0215912 A1 | 8/2013 | Shkunov et al. | |
| 2013/0327928 A1* | 12/2013 | Leach | B82Y 20/00 250/216 |
| 2014/0194314 A1 | 7/2014 | Walsworth et al. | |
| 2015/0083923 A1 | 3/2015 | Stanton et al. | |

OTHER PUBLICATIONS

Non-Final Office Action for U.S. Appl. No. 14/169,906 mailed Sep. 18, 2014, 16 pages.
Non-Final Office Action for U.S. Appl. No. 13/891,692, mailed Apr. 16, 2015, 10 pages.
Notice of Allowance for U.S. Appl. No. 14/107,231, mailed Apr. 16, 2015, 9 pages.
Notice of Allowance for U.S. Appl. No. 14/169,906, mailed Apr. 6, 2015, 8 pages.
Notice of Allowance for U.S. Appl. No. 14/210,809, mailed Jun. 9, 2015, 7 pages.
Author Unknown, "Luminescent Up-conversion Nanocrystals," Biochemical Products, Sigma-Aldrich Co. LLC, 2013, http://www.sigmaaldrich.com/life-science/biochemicals/biochemical-products, accessed Apr. 23, 2013, 1 page.
Author Unknown, "Sunstone Upconverting Nanocrystals UCP 475," Material Safety Data Sheet, Version 5.1, Sigma-Aldrich Co. LLC, Revised May 31, 2012, 6 pages.
Author Unknown, "Sunstone Luminescent UCP Nanocrystals," Technical Document, Sigma-Aldrich Co. LLC, http://www.sigmaaldrich.com/technical-documents/articles/biology/upconverting-ucp-nanocrystals.html, accessed Apr. 23, 2013, 6 pages.
Shun, Poh Hou, "Towards a High Quality Polarization-Entangled Multi-Photon Source," A Thesis Submitted for the Degree of Master of Science, Department of Physics, National University of Singapore, 2009, 113 pages.
Gorris et al., "Photon-upconverting nanoparticles for optical encoding and multiplexing of cells, biomolecules, and microspheres," Angewandte Chemie International Edition, vol. 52, No. 13, Mar. 25, 2013, pp. 3584-3600 (abstract only).
McCutcheon et al., "Broadband frequency conversion and shaping of single photons emitted from a nonlinear cavity," Optics Express, vol. 17, No. 25, Dec. 7, 2009, 15 pages.
Suyver et al., "Novel materials doped with trivalent lanthanides and transition metal ions showing near-infrared to visible photon upconversion," Optical Materials, vol. 27, No. 6, Mar. 2005, pp. 1111-1130 (abstract only).
Tyson, Jeff et al., "How Airport Security Works," the Pallet, vol. 55, Feb. 2008, travel.howstuffworks.com/airport-security.htm, 5 pages.
Girard, C. et al., "The physics of the near-field," Reports on Progress in Physics, vol. 63, No. 6, Jun. 2000, IOP Publishing Ltd., 46 pages.
Jain, P., "Plasmons in Assembled Metal Nanostructures: Radiative and Nonradiative Properties, Near-Field Coupling and its Universal Scaling Behavior," Doctoral Dissertation, Georgia Institute of Technology, Apr. 2008, 316 pages.
Pucci, A. et al., "Chapter 8: Electromagnetic Nanowire Resonances for Field-Enhanced Spectroscopy," Lecture Notes in Nanoscale Science and Technology, vol. 3: One-Dimensional Nanostructures, Springer Science+Business Media, LLC, 2008, pp. 175-215.
Tiwari, S. et al., "A silicon nanocrystals based memory," Applied Physics Letters, vol. 68, No. 10, Mar. 4, 1996, American Institute of Physics, 3 pages.
Final Office Action for U.S. Appl. No. 13/891,692, mailed Sep. 18, 2015, 11 pages.
Non-Final Office Action for U.S. Appl. No. 14/095,513, mailed Sep. 24, 2015, 19 pages.
Ye, Xingchen, et al., "Competition of shape and interaction patchiness for self-assembling nanoplates," Nature chemistry: Advance Online Publication, vol. 5, Issue 6, Paper No. NCHEM-12070903B, May 12, 2013, Nature, www.nature.com/naturechemistry, 9 pages.
Non-Final Office Action for U.S. Appl. No. 13/891,692, mailed Jan. 7, 2016, 10 pages.
Final Office Action for U.S. Appl. No. 13/891,692, mailed Jun. 13, 2016, 7 pages.
Final Office Action for U.S. Appl. No. 14/095,513, mailed Apr. 6, 2016, 14 pages.
Notice of Allowance for U.S. Appl. No. 14/095,513, mailed Jun. 14, 2016, 9 pages.
Non-Final Office Action for U.S. Appl. No. 14/880,612, mailed Apr. 21, 2016, 18 pages.

\* cited by examiner

NEAR-FIELD ENHANCED PHOTON CONVERSION

RELATED APPLICATIONS

This application is a continuation-in-part of and claims the benefit of co-pending U.S. patent application Ser. No. 13/891,692, filed May 10, 2013, entitled MULTI-SPECTRAL PHOTON CONVERTING IMAGING APPARATUS, which claims priority to Provisional Patent Application No. 61/645,514, filed May 10, 2012, entitled, PHOTON CONVERSION IMAGING USING DOPED NANOPARTICLE MATERIALS, each of which is hereby incorporated herein by reference in its entirety.

TECHNICAL FIELD

The embodiments generally relate to photon conversion, and in particular to a near-field enhanced photon conversion assembly that increases the efficiency of photon conversion.

BACKGROUND

Photon conversion materials do not exhibit one hundred percent conversion efficiency. It would be desirable to increase the efficiency of the conversion of photons in received bands into photons in converted bands, and to increase the quantity of converted photons that are directed toward and detected by a sensor.

SUMMARY

The embodiments relate to increasing the efficiency of the photon conversion process with plasmonic near-field enhancement materials. Plasmonic near-field enhancement materials have a negative real, permittivity, such as, for example, a semiconductor or a metal. In one embodiment a photon conversion assembly is provided that includes a first plurality of photon conversion particles configured to convert photons in a first received band to photons in a first converted band. The photon conversion assembly also includes a second plurality of photon conversion particles configured to convert photons in a second received band to photons in a second converted band. A first plasmonic near-field enhancement material that enhances an attraction of photons in the first received band is positioned in proximity to at least some of the first plurality of photon conversion particles, and a second plasmonic near-field enhancement material that enhances an attraction of photons in the second received band is positioned in proximity to at least some of the second plurality of photon conversion particles.

In one embodiment, the first and second plasmonic near-field enhancement materials may be mixed with the first and second pluralities of photon conversion particles to form a mixture, which may then be formed, cast, or otherwise manufactured into a desired shape, such as a planar photon conversion assembly.

In another embodiment, photon conversion particles may be in the form of a photon conversion sheet, and the first and second plasmonic near-field enhancement materials may be part of a near-field enhancement mesh. A side of the near-field enhancement mesh abuts a side of the photon conversion sheet. The near-field enhancement mesh may include a plurality of cells, each cell having one of at least two different configurations. One of the configurations comprises the first plasmonic near-field enhancement material, and another of the configurations comprises the second plasmonic near-field enhancement material.

In another embodiment, a photon conversion assembly that includes a photon conversion layer and a plasmonic near-field enhancement mesh layer is provided. The photon conversion layer includes a first plurality of photon conversion particles configured to convert photons in a first received band to photons in a first converted band, and a second plurality of photon conversion particles configured to convert photons in a second received band to photons in a second converted band. The plasmonic near-field enhancement mesh layer is positioned adjacent to the photon conversion layer. The plasmonic near-field enhancement layer includes a first plurality of cells having a first configuration that generates a first plasmonic near-field enhancement that enhances an attraction of photons in the first received band. The plasmonic near-field enhancement layer also includes a second plurality of cells having a second configuration that generates a second plasmonic near-field enhancement that enhances an attraction of photons in the second received band.

In one embodiment, the first configuration comprises a plurality of edges that form an opening having a first area size, and the second configuration comprises a plurality of edges that form an opening having a second area size, wherein the second area size differs from the first area size.

In another embodiment, the first configuration comprises a border that forms an opening having a first shape, and the second configuration comprises a border that forms an opening having a second shape, wherein the second shape differs from the first shape.

In another embodiment, the photon conversion assembly comprises a plurality of plasmonic near-field enhancement mesh layers placed in an alternating arrangement with a plurality of photon conversion layers.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The embodiments relate to the conversion of photons in received bands to photons in converted bands, and the detection and imaging thereof. Among other advantages, some embodiments facilitate the use of relatively low cost, widely available image sensors to generate images based on photons in received bands that such image sensors would not be capable of detecting.

Figure 1:
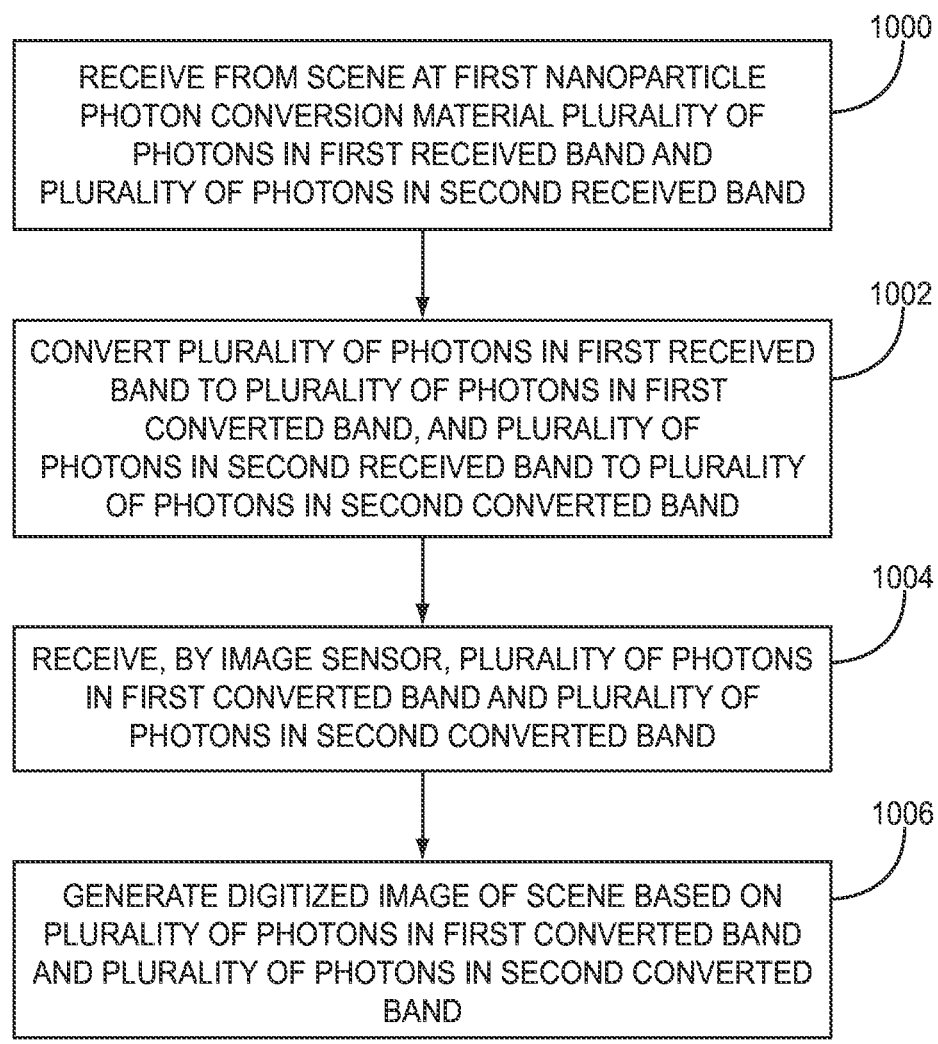
FIG. 1 is a flowchart of a process for generating an image according to one embodiment.

FIG. 1 is a flowchart of a process for generating an image according to one embodiment. A nanoparticle (NP) photon conversion material receives from a scene a plurality of photons in a first received band and a plurality of photons in a second received band (block 1000). The use herein of ordinals, such as first, second, or third, in conjunction with an element is solely for distinguishing what might otherwise be similar or identical labels, such as "first band" and "second band," and does not imply a priority, a type, an importance, or other attribute, unless otherwise stated herein. The phrase "band" refers to a range of photon wavelengths. The phrase "nanoparticle" is used herein to refer to a particle that is between about one nanometer to about 10,000 nanometers in size.

The NP photon conversion material converts the plurality of photons in the first received band to a plurality of photons in a first converted band, and the plurality of photons in the second received band to a plurality of photons in a second converted band (block 1002). The number of photons in the first received band may differ from the number of photons in the first converted band. An image sensor receives the plurality of photons in the first converted band and the plurality of photons in the second converted band (block 1004). The image sensor generates a digitized image of the scene based on the plurality of photons in the first converted band and the plurality of photons in the second converted band (block 1006). For purposes of illustration, many of the embodiments will be discussed in the context of received bands comprising non-visible bands, and converted bands comprising visible and/or near-infrared bands, but the embodiments are not limited to converted bands of any particular wavelengths. However, the conversion of photons to visible and/or near-infrared bands, in some embodiments, may facilitate the use of relatively low-cost image sensors used widely in digital cameras since such low-cost image sensors are typically sensitive in the visible and near-infrared bands.

Figure 2:
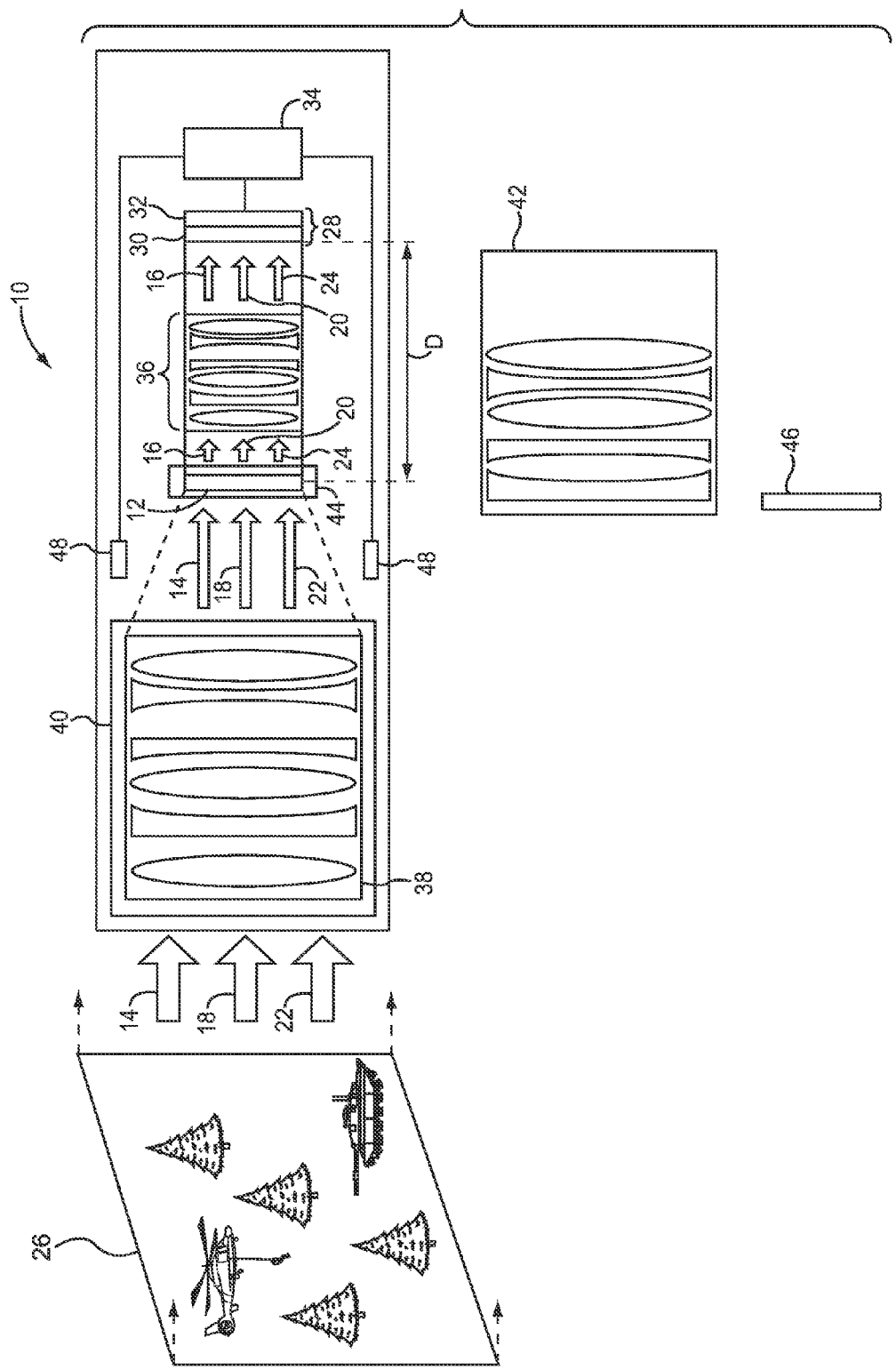
FIG. 2 is a block diagram of a multi-spectral imaging apparatus according to one embodiment.

FIG. 2 is a block diagram of a multi-spectral imaging apparatus 10 according to one embodiment. The imaging apparatus 10 includes a first NP photon conversion material 12 that is configured to convert one or more pluralities of photons in received bands to corresponding pluralities of photons in converted bands. For purposes of illustration, the embodiments will be discussed herein in the context of three received bands and three converted bands, but the embodiments are not limited to any number of received bands or converted bands. Generally, the number of bands utilized will be system dependent, and in large part may be dependent on the particular image sensor used, as discussed in greater detail herein.

In this example, the first NP photon conversion material 12 is configured to convert a plurality of photons 14 in a first received band to a plurality of photons 16 in a first converted band, a plurality of photons 18 in a second received band to a plurality of photons 20 in a second converted band, and a plurality of photons 22 in a third received band to a plurality of photons 24 in a third converted band. The plurality of photons 14 in the first received band, the plurality of photons 18 in the second received band and the plurality of photons 22 in the third received band are received from a scene 26, which may comprise, for example, all objects and matter that falls within the field of view (FOV) of the imaging apparatus 10, or the FOV of a device to which the imaging apparatus 10 is communicatively coupled.

The first NP photon conversion material 12 comprises materials, such as frequency converting nanocrystals, that are capable of "upconverting" photons of one energy level to photons of a higher energy level, such as upconverting photons in an infrared band to photons in a visible band or other converted band, or "downconverting" photons of one energy level to photons of a lower energy level, such as downconverting photons in an X-ray band to photons in a visible band or other converted band. In one embodiment, the first NP photon conversion material 12 may be coated onto a glass, or other transmissive substrate, that is transparent to photons in the converted bands, according to the particular upconverting or downconverting scheme used.

Generally such materials are engineered to absorb energy at one wavelength and emit energy at a different wavelength, thus "converting" photons of one band to photons of another band. Such materials may be synthesized, for example, using specific compositions of individual rare earth elements and other host elements. Upconversion may occur through a combination of a trivalent rare-earth sensitizer (e.g. Yb, Nd, Er, or Sm) as the element that initially absorbs the electromagnetic radiation and a second lanthanide activator (e.g. Er, Ho, Pr, Tm) ion in an optical passive crystal lattice that serves as the emitting elements. By varying the concentrations and ratios of rare earth elements, different emission spectra can be elicited from the same combination of elements. Such materials are available, for example, from Sigma-Aldrich, 3050 Spruce Street, St. Louis, Mo. 63103. In some embodiments, the first NP photon conversion material 12 may comprise a mixture of elements that performs the desired conversion of received bands to converted bands, or alternatively, the first NP photon conversion material 12 may be patterned in a desired configuration, such as a striped configuration, a checkerboard configuration, or may be configured as grating planes, or as a linear variable filter.

The imaging apparatus 10 also includes an image sensor 28 that is configured to receive the plurality of photons 16 in the first converted band, the plurality of photons 20 in the second converted band, and the plurality of photons 24 in the third converted band, and based thereon, generate a digital image. The image sensor 28 comprises a photodetector array 30 and readout circuitry 32. Some of the functionality discussed herein with regard to the imaging apparatus 10 may be implemented under the control of a controller 34. The controller 34 may comprise a programmable central processing unit (CPU), application specific integrated circuit, or the like, that is configured to implement functionality discussed herein. In one embodiment, programming instructions may be stored on a memory (not illustrated), and executed by the controller 34 to implement functionality described herein.

The photodetector array 30 is multi-spectral and capable of detecting photons at different bands, and in particular capable of detecting photons at the different converted bands that are received by the photodetector array 30. In one embodiment, the photodetector array 30 includes a color-filter array capable of separating different incoming visible and/or near-infrared converted bands.

In the embodiment illustrated in FIG. 2, the first NP photon conversion material 12 may be positioned at a distance D from the image sensor 28. The distance D may position the first NP photon conversion material 12 in an image plane that is conjugant to an image plane of the photodetector array 30. While the distance D is system dependent, the distance D, in some embodiments, may range from 1 mm to 100 mm. The imaging apparatus 10 may include a lens arrangement 36 that is configured to direct the plurality of photons 16 in the first converted band, the plurality of photons 20 in the second converted band, and the plurality of photons 24 in the third converted band onto the image sensor 28.

The imaging apparatus 10 may also include a lens arrangement 38 that is configured to direct the plurality of photons 14 in the first received band, the plurality of photons 18 in the second received band and the plurality of photons 22 in the third received band onto the first NP photon conversion material 12. The lens arrangement 38 may be configured to direct photons in particular received bands, but be incapable of, or less efficient at, directing photons of other received bands. Accordingly, in one embodiment, the imaging apparatus 10 includes a lens arrangement receiver 40 that has a released mode and an engaged mode. The lens arrangement receiver 40 is configured to fix the lens arrangement 38 with respect to the first NP photon conversion material 12 when in the engaged mode. In the released mode, a user may remove the lens arrangement 38 from the lens arrangement receiver 40, and insert a different lens arrangement 42 that may be configured to direct photons in one or more different received bands onto the first NP photon conversion material 12. The lens arrangement receiver 40 may comprise any suitable interface, such as a threaded interface, friction interface, or the like.

Similarly, the first NP photon conversion material 12 may be configured to convert pluralities of photons of particular received bands into corresponding pluralities of photons of converted bands, but be ineffective at converting photons of other received bands. Accordingly, the imaging apparatus 10 may include a NP photon conversion material receiver 44 that has a released mode and an engaged mode, and that is configured to fix the NP photon conversion material 12 with respect to the image sensor 28 when in the engaged mode. If the detection of different pluralities of received bands are of interest to a user, the user may release the first NP photon conversion material 12 from the NP photon conversion material receiver 44, and insert a second NP photon conversion material 46 into the NP photon conversion material receiver 44. Thus, the imaging apparatus 10 may facilitate the conversion of any desired pluralities of photons of received bands to desired pluralities of photons of converted bands through the selection of a particular NP photon conversion material, and inserting particular NP photon conversion material into the NP photon conversion material receiver 44.

For example, the first NP photon conversion material 12 may convert a plurality of photons in the short-wave infrared band to a plurality of photons in a red visible band, and a plurality of photons in the mid-wave infrared band to a plurality of photons in a blue visible band. The second NP photon conversion material 46 may convert a plurality of photons in a particular long-wave infrared band to a plurality of photons in a red visible band, and a plurality of photons in a different long-wave infrared band to a plurality of photons in a blue visible band.

The use of different NP photon conversion materials may be done independent of, or in conjunction with, the use of a particular lens arrangement 38, 42, and insertion thereof into the lens arrangement receiver 40. For example, the lens arrangement 38 may be configured to direct photons in the short-wave and mid-wave infrared bands. The lens arrangement 42 may be configured to direct photons in the long-wave band. Different NP photon conversion materials and/or lens arrangements may be used to generate images of the same scene 26.

The imaging apparatus 10 may include one or more energy sources 48 that are configured to increase an energy level of the first NP photon conversion material 12. Increasing the energy level of the first NP photon conversion material 12 may increase photon conversion efficiency. The energy sources 48 may emit energy at a particular wavelength that when absorbed by the first NP photon conversion material 12 increases the energy level of the first NP photon conversion material 12. In one embodiment, during a down-cycle, sometimes referred to as an off-cycle, of the image sensor 28, the controller 34 may activate the energy sources 48 to emit energy at the desired wavelength(s) for a period of time during the off-cycle. The controller 34 may then, immediately prior to an up-cycle, sometimes referred to as an on-cycle, of the image sensor 28, deactivate the energy sources 48. In other embodiments, particularly wherein the energy sources 48 comprise an electromagnetic field, or an electron beam, the energy sources 48 may remain continuously on during off- and on-cycles of the image sensor 28. In some embodiments, the energy sources 48 may comprise an electromagnetic energy source, such as a laser light, or an electric energy source, such as a static field generated from a transparent capacitor plate positioned on either side of the first NP photon conversion material 12.

Figure 3:
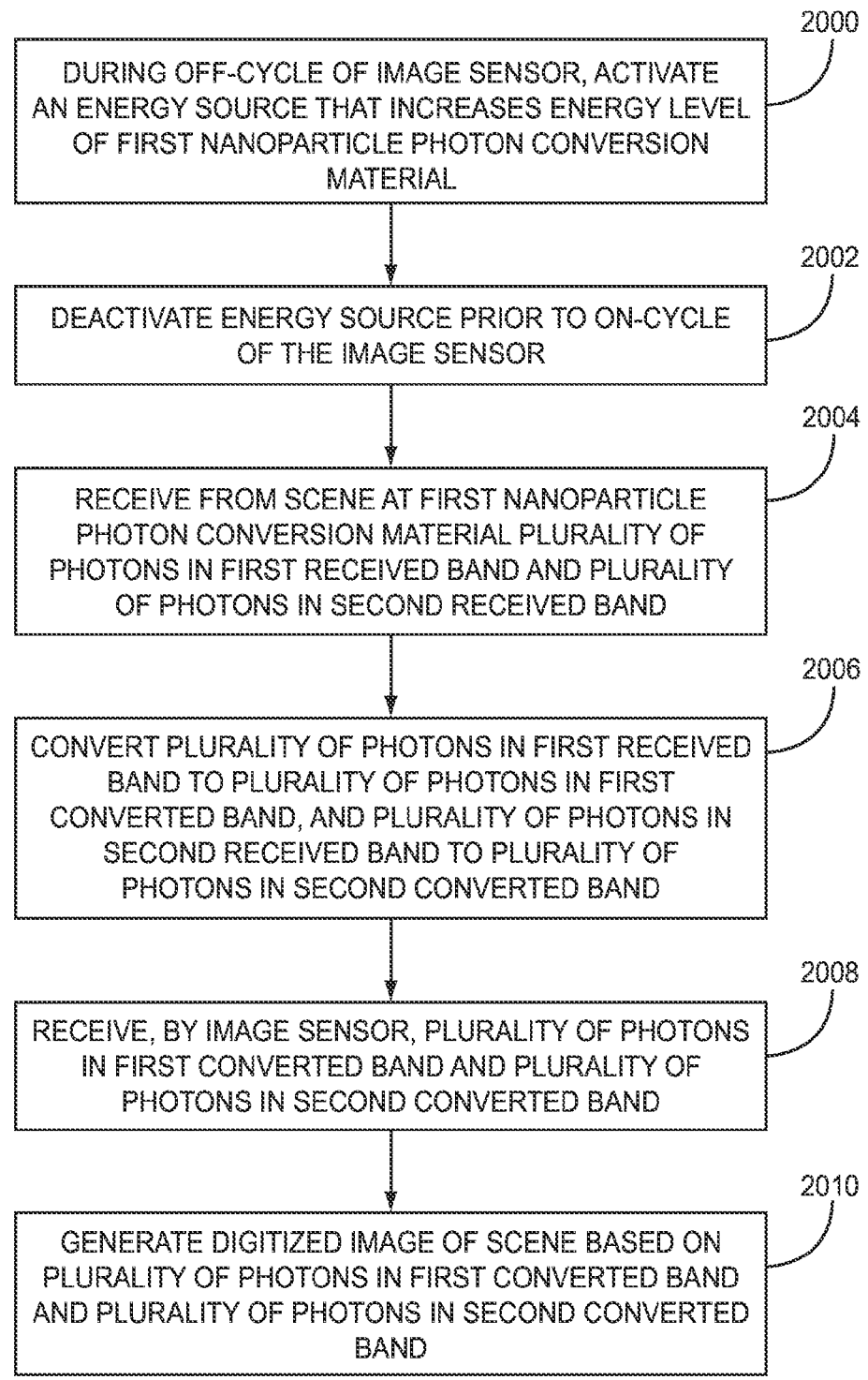
FIG. 3 is a flowchart of a method for increasing an energy level of a nanoparticle photon conversion material according to one embodiment.

FIG. 3 is a flowchart of a method for increasing an energy level of a NP photon conversion material according to one embodiment, and will be discussed in conjunction with FIG. 2. During an off-cycle of the image sensor 28, the controller 34 activates the energy sources 48 to increase the energy level of the first NP photon conversion material 12 (block 2000). Prior to the on-cycle of the image sensor 28, the controller 34 deactivates the energy sources 48 (block 2002). Processing in blocks 2004-2010 may be substantially similar or identical to blocks 1000-1006, respectively, as described above with regard to FIG. 1.

Figure 4:
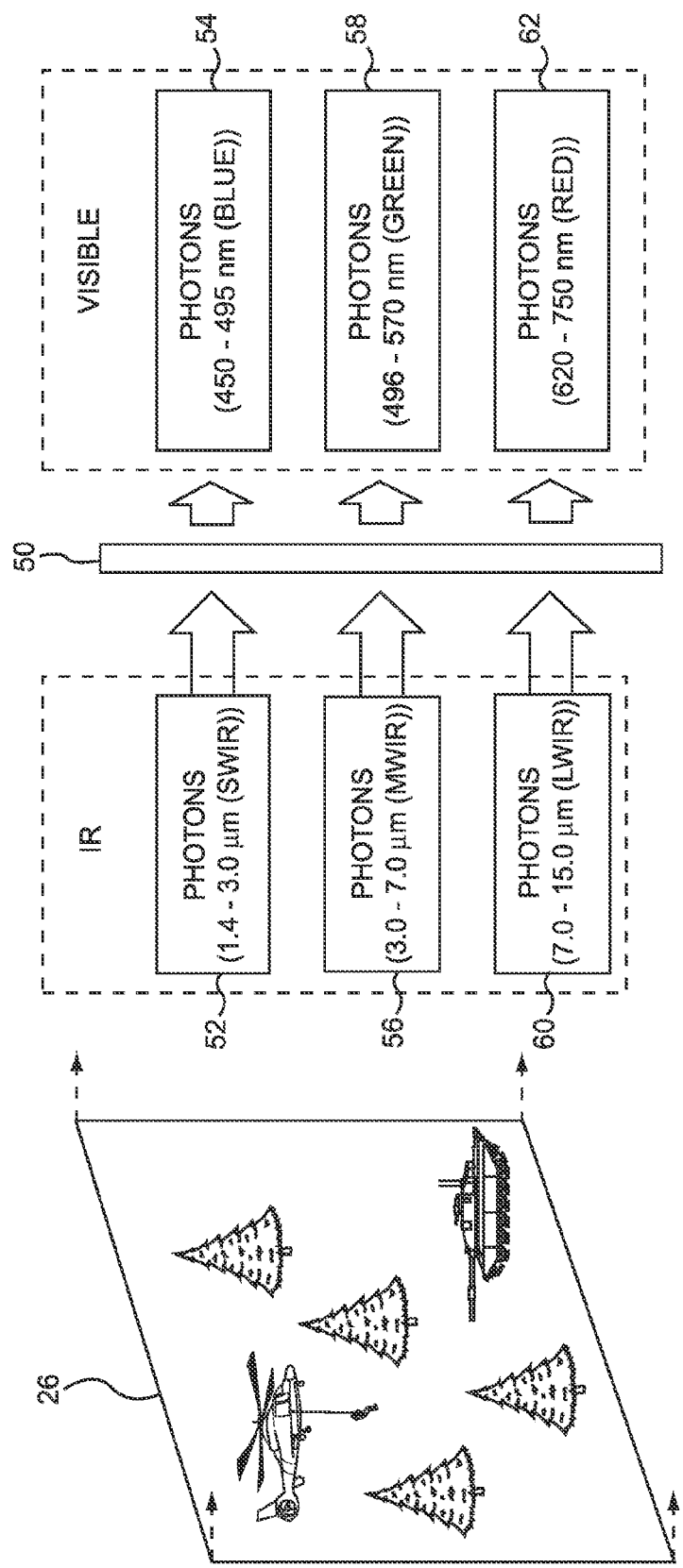
FIG. 4 is a block diagram illustrating an example conversion of pluralities of photons in received bands to corresponding pluralities of photons in converted bands according to one embodiment.

FIG. 4 is a block diagram illustrating an example conversion of pluralities of photons in received bands to corresponding pluralities of photons in converted bands according to one embodiment. In this embodiment, a NP photon conversion material 50 is configured to convert a plurality of photons 52 in a short-wave infrared band comprising wavelengths of about 1.4 urn to about 3.0 urn to a plurality of photons 54 in a blue visible band comprising wavelengths of about 450 nm to about 495 nm. The NP photon conversion material 50 is also configured to convert a plurality of photons 56 in a mid-wave infrared band comprising wavelengths of about 3.0 μm to about 7.0 μm to a plurality of photons 58 in a green visible band comprising wavelengths of about 496 nm to about 570 nm. The NP photon conversion material 50 is also configured to convert a plurality of photons 60 in a long-wave infrared band comprising wavelengths of about 7.0 μm to about 15.0 μm to a plurality of photons 62 in a red visible band comprising wavelengths of about 620 nm to about 750 nm.

Figure 5:
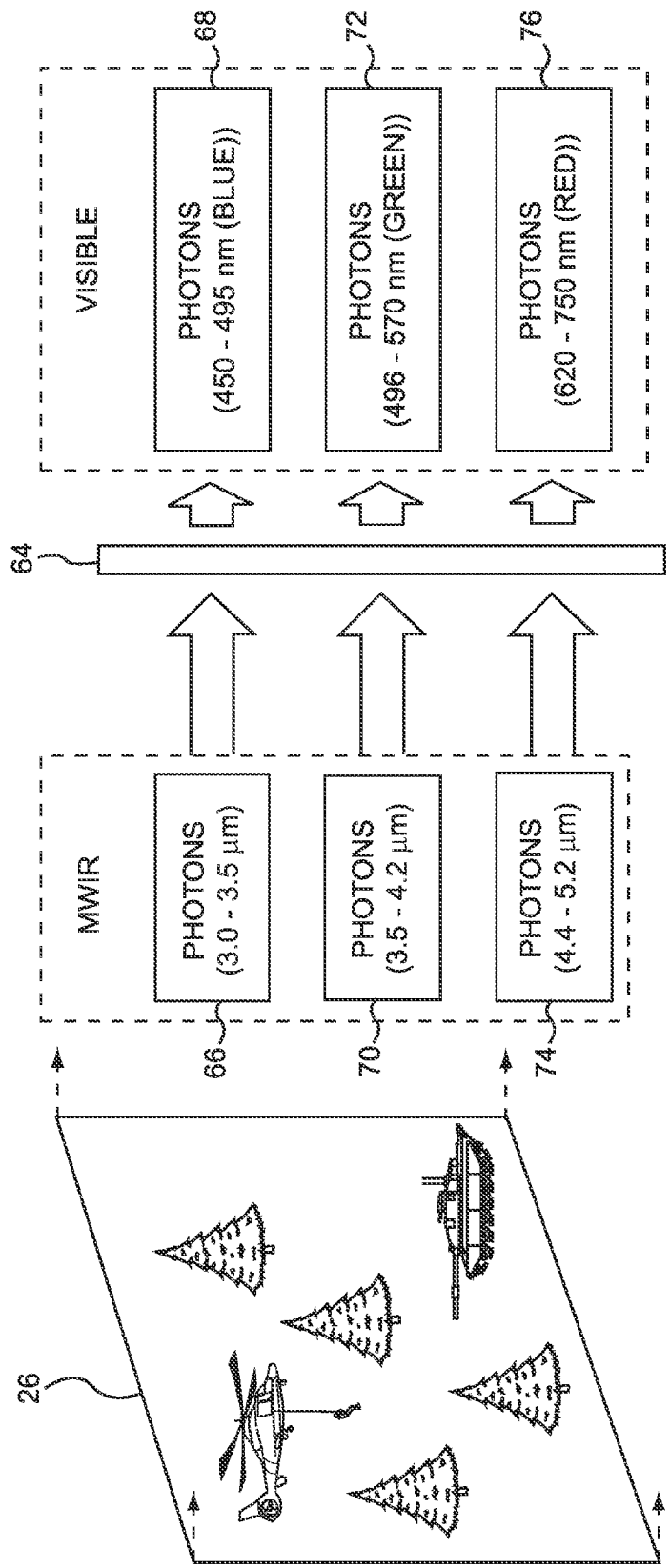
FIG. 5 is a block diagram illustrating an example conversion of pluralities of photons in received bands to corresponding pluralities of photons in converted bands according to another embodiment.

FIG. 5 is a block diagram illustrating an example conversion of pluralities of photons in received bands to corresponding pluralities of photons in converted bands according to another embodiment. In this embodiment, a NP photon conversion material 64 is configured to convert a plurality of photons 66 in a first mid-wave infrared band comprising wavelengths of about 3.0 μm to about 3.5 μm to a plurality of photons 68 in a blue visible band comprising wavelengths of about 450 nm to about 495 nm. The NP photon conversion material 64 is also configured to convert a plurality of photons 70 in a second mid-wave infrared band comprising wavelengths of about 3.5 μm to about 4.2 μm to a plurality of photons 72 in a green visible band comprising wavelengths of about 496 nm to about 570 nm. The NP photon conversion material 64 is also configured to convert a plurality of photons 74 in a third mid-wave infrared band comprising wavelengths of about 4.4 μm to about 5.2 μm to a plurality of photons 76 in a red visible band comprising wavelengths of about 620 nm to about 750 nm. Thus, as illustrated by FIGS. 4 and 5, any desired granularity of photons of received bands may be converted to a corresponding converted band for imaging by the image sensor 28.

Figure 6:
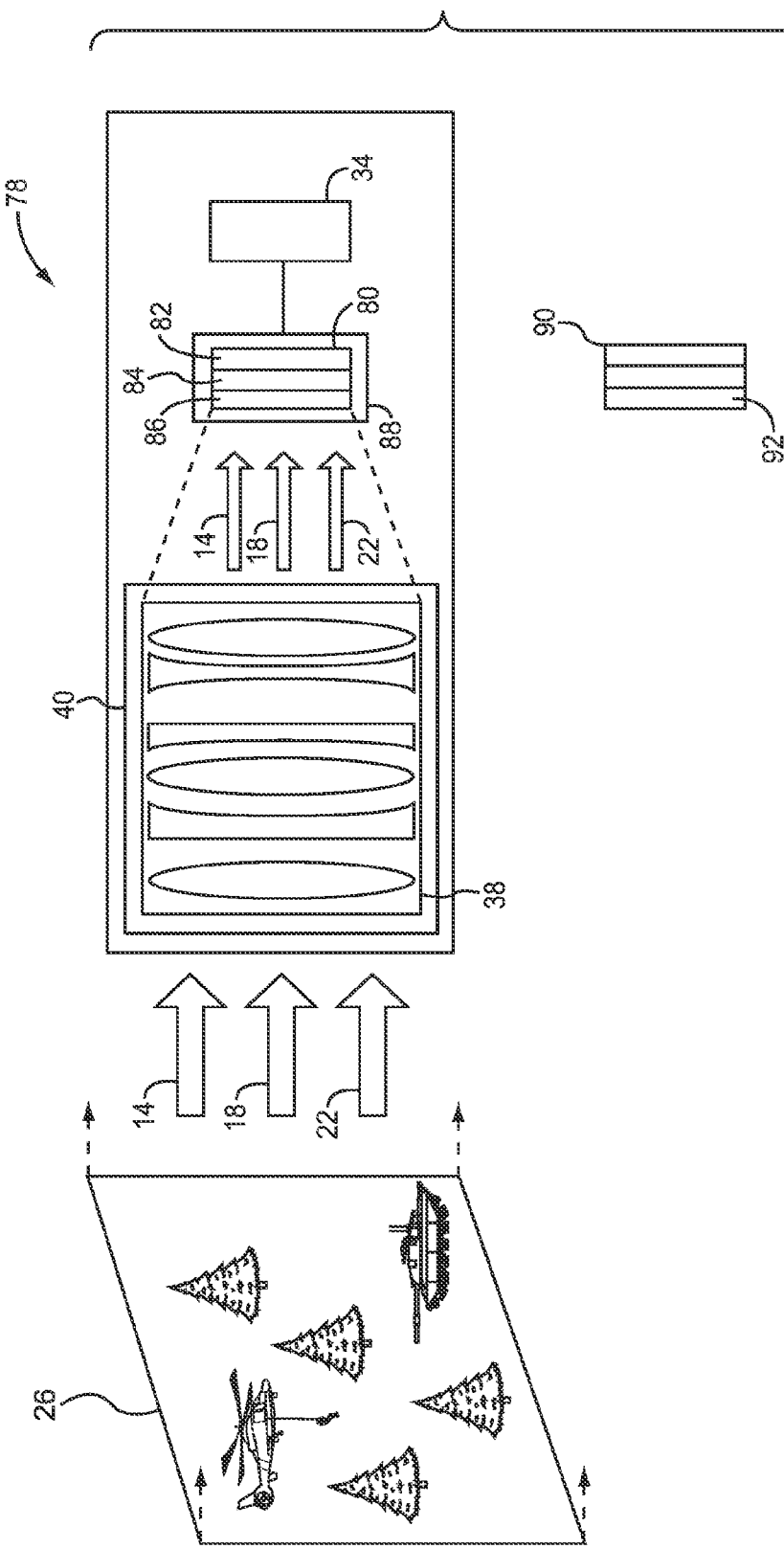
FIG. 6 illustrates a block diagram of a multi-spectral imaging apparatus according to another embodiment.

While FIGS. 5 and 6, for purposes of illustration, discuss the conversion of photons in infrared received bands, the embodiments are not so limited. The embodiments have applicability in a variety of received bands, including the X-ray and ultraviolet received bands.

FIG. 6 illustrates a block diagram of an imaging apparatus 78 according to another embodiment. In this embodiment, the imaging apparatus 78 comprises an image sensor 80 that comprises readout circuitry 82, photodetector array 84, and a NP photon conversion material 86. Thus, in this embodiment, the NP photon conversion material 86 is integrated with the photodetector array 84 and the readout circuitry 82. In this embodiment, a manufacturer of the image sensor 80 may apply the NP photon conversion material 86 onto a surface that is in proximity to the photodetector array 84, such as one or more microns from the photodetector array 84.

In this embodiment, the NP photon conversion material 86 may be configured to convert pluralities of photons 14, 18, 22 of particular received bands into corresponding pluralities of photons of converted bands, but be ineffective at converting photons of other received bands. Accordingly, the imaging apparatus 78 may include an image sensor receiver 88 that has a released mode and an engaged mode, and is configured to fix the image sensor 80 with respect to the lens arrangement 38 when in the engaged mode. In order to detect different pluralities of received bands, the user may release the image sensor 80 from the image sensor receiver 88, and insert a suitable second image sensor 90 into the image sensor receiver 88. The second image sensor 90 may include a second NP photon conversion material 92 that is configured to convert different pluralities of received bands to corresponding pluralities of photons of converted bands than that of the NP photon conversion material 86.

Figure 7:
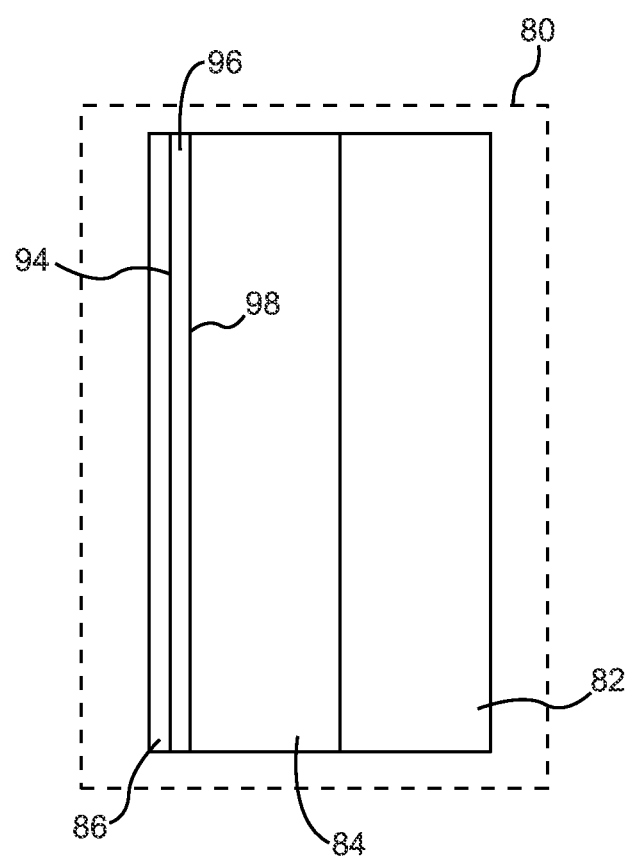
FIG. 7 is a block diagram of an image sensor illustrated in FIG. 6 according to one embodiment.

FIG. 7 is a block diagram of the image sensor 80 according to one embodiment. The NP photon conversion material 86 may be coated on a first surface 94 of a glass, or other transmissive substrate 96. The substrate 96 may comprise any suitable transmissive substrate that allows the emission of photons in converted bands toward the photodetector array 84. A second surface 98 of the substrate 96 is adjacent to the photodetector array 84. In one embodiment, the NP photon conversion material 86 coated on the first surface 94 of the transmissive substrate 96 is a distance no more than one order (<10) of the converted band of wavelengths away from the photodetector array 84.

The present embodiments, for purposes of illustration, have been described in the context of particular received bands and particular converted bands, but the embodiments are not so limited, and apply to any received bands that may be converted to any converted bands by a suitable NP photon conversion material. Other non-limiting examples of such bands include a first received band that comprises a long-wave infrared band, a second received band that comprises a first mid-wave infrared band, a first converted band that comprises a second mid-wave infrared band that is different from the first mid-wave infrared band, and a second converted band that comprises a short-wave infrared band. Additional non-limiting examples include the conversion of one or more received long-wave infrared bands to one or more corresponding converted short-wave infrared bands, the conversion of one or more received ultraviolet bands to one or more corresponding converted visible (e.g., red, blue, or green) bands, and the conversion of one or more received X-ray bands to one or more corresponding converted ultraviolet bands.

Figure 8:
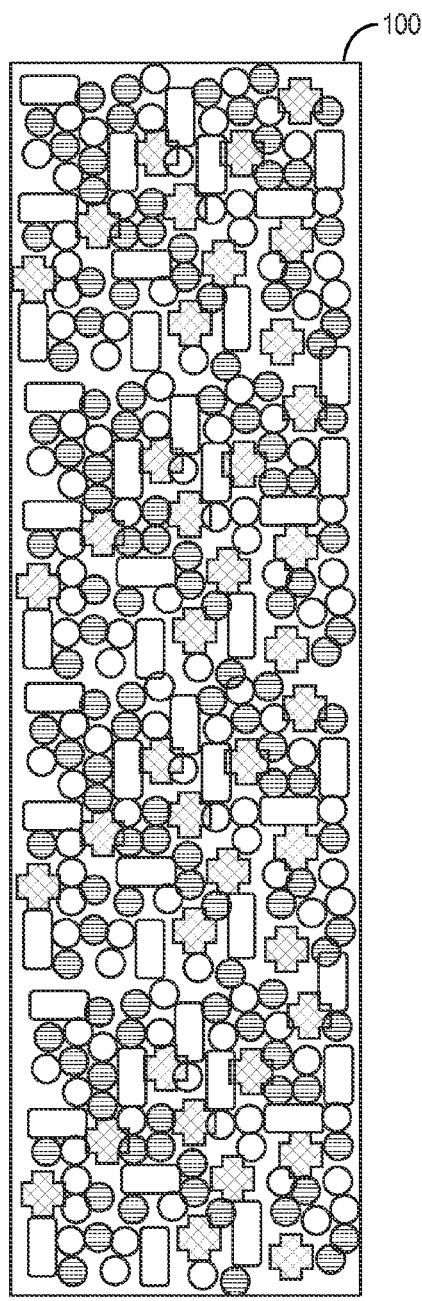
FIG. 8 is a block diagram of a photon conversion assembly according to one embodiment.

FIG. 8 is a block diagram of a photon conversion assembly 100 according to one embodiment. The photon conversion assembly 100 includes a first plurality of photon conversion particles 102 that is configured to convert photons in a first received band to photons in a first converted band. Thus, the first plurality of photon conversion particles 102 may be selected based on the particular first received band and the particular first converted band. The photon conversion assembly 100 also includes a second plurality of photon conversion particles 104 that is configured to convert photons in a second received band to photons in a second converted band. The photon conversion assembly 100 also includes a first plasmonic near-field enhancement material 106 that enhances an attraction of photons in the first received band, and that is positioned in proximity to the first plurality of photon conversion particles 102.

In some embodiments the first received band comprises a band of photon wavelengths that are longer wavelengths than the first converted band, and thus photons in the first received band are upconverted to photons in the first converted band. The second received band comprises a different band than the first received band, but may also be upconverted to a second converted band that is different from the first converted band. In other embodiments, the first received band may be upconverted, such as from an infrared band to a visible band, while the second received band is downconverted to the second converted band, such as from an ultraviolet band to a different visible band. While for purposes of illustration only two received bands and two converted bands are discussed herein, the embodiments are not limited to any particular number of received or converted bands.

The first plasmonic near-field enhancement material 106 comprises any material that has a plasmonic near-field enhancement in the first received band. The first plasmonic near-field enhancement material 106 may comprise a particular material known to have a near-field enhancement in the first received band, including, for example, metals such as silver, gold, aluminum, metal alloys, silica-silver core-shell nanoparticles, and doped semiconductors such as indium-tin-oxide, and the like. The first plasmonic near-field enhancement material 106 may also comprise a particular shape known to result in a near-field enhancement in the first received band, such as a sphere having a particular diameter, a rod having a particular length and circumference, a cross having particular dimensions, or any other suitable shape that results in a plasmonic near-field enhancement in the first received band. The plasmonic near-field enhancement of the first plasmonic near-field enhancement material 106 channels photons in the first received band into the photon conversion assembly 100 for conversion by the first plurality of photon conversion particles 102.

The photon conversion assembly 100 also includes a second plasmonic near-field enhancement material 108 that that enhances an attraction of photons in the second received band that is positioned in proximity to the second plurality of photon conversion particles 104. As discussed above with respect to the first plasmonic near-field enhancement material 106, the second plasmonic near-field enhancement material 108 may also comprise a particular material known to have a near-field enhancement in the second received band, and/or comprise a particular shape known to result in a near-field enhancement in the second received band. Thus, the second plasmonic near-field enhancement material 108 may comprise a different material than that of the first plasmonic near-field enhancement material 106, and may comprise a different shape than that of the first plasmonic near-field enhancement material 106. The near-field enhancement of the second plasmonic near-field enhancement material 108 channels photons in the second received band into the photon conversion assembly 100 for conversion by the second plurality of photon conversion particles 104.

In one embodiment, the first plasmonic near-field enhancement material 106 is positioned in proximity to the first plurality of photon conversion particles 102, and the second plasmonic near-field enhancement material 108 is positioned in proximity to the second plurality of photon conversion particles 104, by mixing together the first plurality of photon conversion particles 102, the second plurality of photon conversion particles 104, the first plasmonic near-field enhancement material 106, and the second plasmonic near-field enhancement material 108.

In some embodiments, the first and second plasmonic near-field enhancement material 106, 108 may be coupled to the first and second plurality of photon conversion particles 102, 104 via a functionalization process which may differ based on the type of a particular near-field enhancement material and particular photon conversion particle. Such functionalization may include a solution-based approach, such as aqueous or organic phase processes. In one embodiment, both the first and second plasmonic near-field enhancement material 106, 108 comprise nanoparticles of a particular material, each of which may comprise different materials, and/or shapes, and are mixed in a colloidal solution with the first plurality of photon conversion particles 102 and the second plurality of photon conversion particles 104. The solution may then precipitate and dry, and then be formed into a relatively planar sheet comprising a mixture of the pluralities of the first and second photon conversion particles 102, 104, and the first and second plasmonic near-field enhancement material 106, 108.

Figure 9:
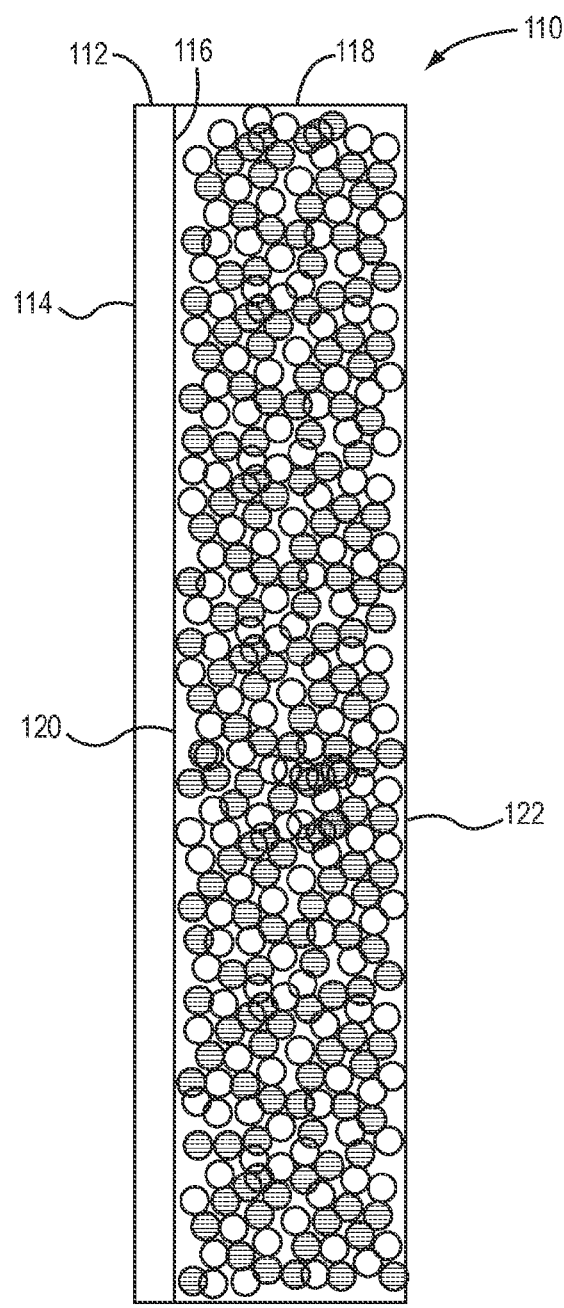
FIG. 9 is a block diagram of the photon conversion assembly according to another embodiment.

FIG. 9 is a block diagram of a photon conversion assembly 110 according to another embodiment. In this embodiment, the photon conversion assembly 110 includes a plasmonic near-field enhancement mesh layer 112. In some embodiments, the plasmonic near-field enhancement mesh layer 112 is relatively planar and has a first side 114 and a second side 116. The plasmonic near-field enhancement mesh layer 112 may also be referred to as a near-field enhancement mesh. A photon conversion layer 118 has a first side 120 and a second side 122. The photon conversion layer 118 comprises the first plurality of photon conversion particles 102 and the second plurality of photon conversion particles 104, and is positioned adjacent to, or abuts, the plasmonic near-field enhancement mesh layer 112.

In one embodiment, the plasmonic near-field enhancement mesh layer 112 comprises a plurality of cells that has a first configuration that generates a first near-field enhancement that enhances an attraction of photons in the first received band. The plasmonic near-field enhancement mesh layer 112 also includes a second plurality of cells that have a second configuration that generates a second near-field enhancement that enhances an attraction of photons in the second received band. The plasmonic near-field enhancement mesh layer 112 may comprise any suitable material or materials, including, for example, alternating metal-dielectric layers, silver or gold, or doped semiconductors. The first configuration may comprise a particular cell shape that results in a near-field enhancement of photons in the first received band. Similarly, the second configuration may comprise a particular cell shape that results in a near-field enhancement of photons in the second received band.

Figure 10A:
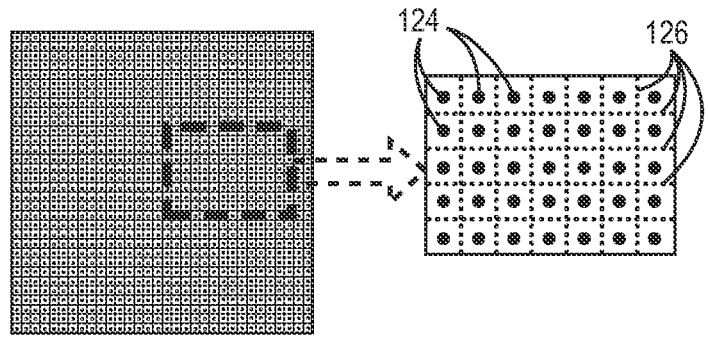
FIGS. 10A-10C illustrate different example cell configurations of a plasmonic near-field enhancement layer.
Figure 10B:
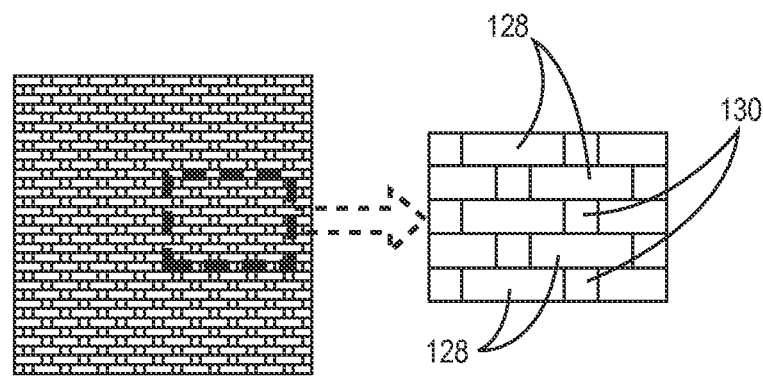
Figure 10C:
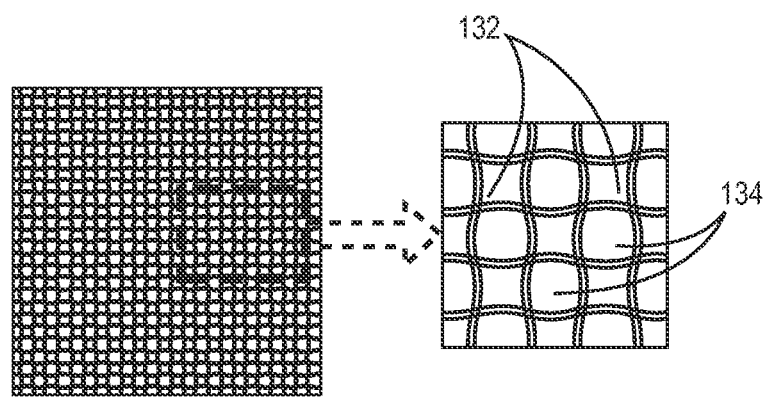

FIGS. 10A-10C illustrate different example cell configurations of the plasmonic near-field enhancement layer 112. FIG. 10A illustrates an example first cell configuration 124 and a second cell configuration 126. The first cell configuration 124 has a first configuration that includes an opening in the shape of a circle having a first diameter.

The second cell configuration 126 has a second configuration that includes an opening in the shape of a circle having a second diameter that is smaller than the first diameter. The first cell configuration 124 may, for example, cause a near-field enhancement of photons in the first received band, and the second cell configuration 126 may, for example, cause a near-field enhancement of photons in the second received band.

FIG. 10B illustrates an example first cell configuration 128 and a second cell configuration 130. The first cell configuration 128 has a first configuration that includes a plurality of edges that form an opening in the shape of a rectangle having a first area size. The second cell configuration 130 has a second configuration that includes a plurality of edges that form an opening in the shape of a rectangle having a second area size that is smaller than the first area size. The first cell configuration 128 may, for example, cause a near-field enhancement of photons in the first received band, and the second cell configuration 130 may, for example, cause a near-field enhancement of photons in the second received band.

FIG. 10C illustrates an example first cell configuration 132 and a second cell configuration 134. The first cell configuration 132 has a first configuration that includes a border that forms an opening in a first shape. The second cell configuration 134 has a second configuration that includes a border that forms an opening in a second shape that is different from the first shape. The first cell configuration 132 may, for example, cause a near-field enhancement of photons in the first received band, and the second cell configuration 134 may, for example, cause a near-field enhancement of photons in the second received band.

FIGS. 10A-10C illustrate example configurations of cells in the plasmonic near-field enhancement layer 112, and the embodiments are not limited to cells of any particular shape.

Figure 11:
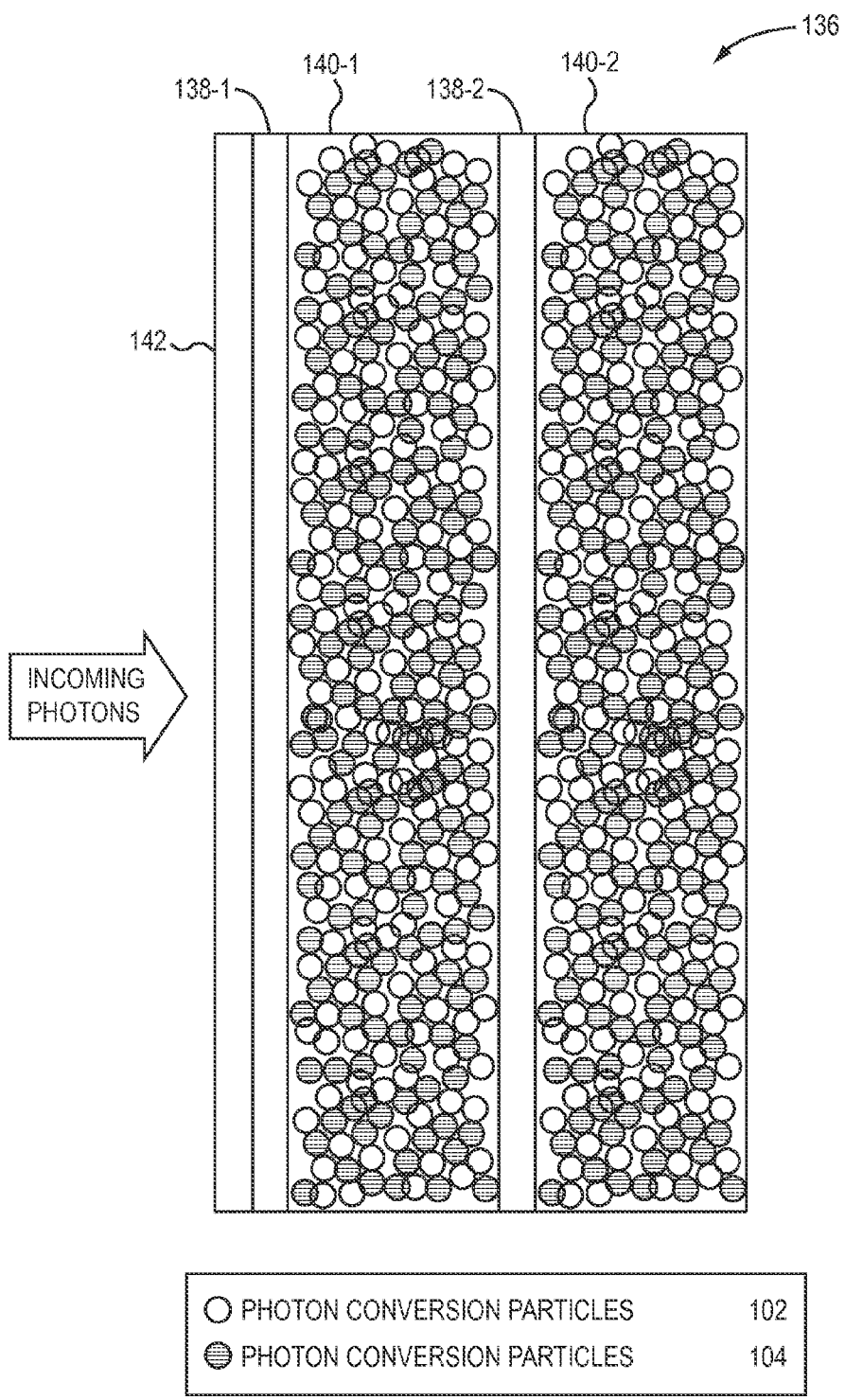
FIG. 11 is a block diagram of a multiple layer photon conversion assembly, according to another embodiment.

FIG. 11 is a block diagram of a photon conversion assembly 136 according to another embodiment. The photon conversion assembly 136 comprises a plurality of plasmonic near-field enhancement layers 138-1, 138-2 positioned in an alternating arrangement with a plurality of photon conversion layers 140-1, 140-2. In this embodiment, different layers may have different dielectrics for impedance matching purposes. In other embodiments, additional dielectric layers may be positioned in proximity to the near-field enhancement layers 138-1, 138-2 and photon conversion layers 140-1, 140-2 for impedance matching purposes, such as, for example, via the use of an anti-reflective coating 142.

In some embodiments, near-field enhancement materials 144 may be coupled to the photon conversion particles 102, 104 via a functionalization process which may differ based on the type of a particular near-field enhancement material 144 and particular photon conversion particle 102, 104. Such functionalization may include a solution-based approach, such as aqueous or organic phase processes.

Figure 12:
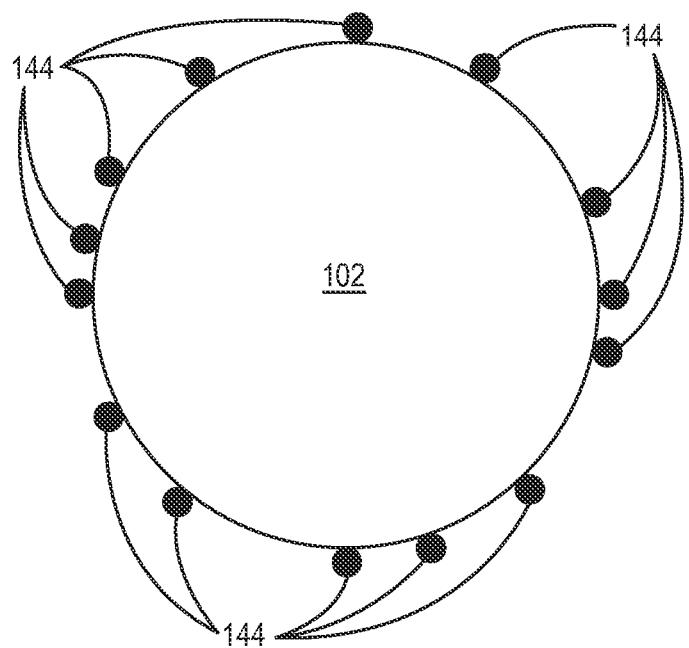
FIG. 12 is a block diagram illustrating a photon conversion particle to which a plurality of plasmonic near-field enhancement materials have been coupled via a functionalization process, according to one embodiment.

FIG. 12 is a block diagram illustrating a photon conversion particle 102 to which a plurality of plasmonic near-field enhancement materials 144 have been coupled via such a functionalization process, according to one embodiment.

The present embodiments have wide applicability and may be utilized in any context in which the detection and imaging of electromagnetic radiation is desirable. One application includes, for example, the conversion of pluralities of photons in mid-wave infrared received bands to corresponding pluralities of photons in converted bands for use in target recognition applications based on shape and spectral content. Another application includes, for example, the conversion of pluralities of photons in ultraviolet received bands in conjunction with the conversion of pluralities of photons in a mid-wave infrared received band to corresponding pluralities of photons in converted bands for use in missile warning systems. Such application may facilitate hot plume detection with significant clutter reduction. Additional applications include the conversion of pluralities of ultraviolet received bands to corresponding converted bands in fingerprint applications, factory quality imaging applications, various consumer products, and hot plume imaging. The embodiments also have applicability in real-time X-ray applications, such as medical applications, security applications, manufacturing applications, applications in the food industry, and the like. The embodiments also have wide applicability in spectroscopy applications.

Those skilled in the art will recognize improvements and modifications to the preferred embodiments of the present disclosure. All such improvements and modifications are considered within the scope of the concepts disclosed herein and the claims that follow.

What is claimed is:

1. A photon conversion assembly, comprising:
   a first plurality of photon conversion particles configured to convert photons in a first received band to photons in a first converted band;
   a second plurality of photon conversion particles configured to convert photons in a second received band to photons in a second converted band;
   a first plasmonic near-field enhancement material that enhances an attraction of photons in the first received band positioned in proximity to at least some of the first plurality of photon conversion particles; and
   a second plasmonic near-field enhancement material that enhances an attraction of photons in the second received band positioned in proximity to at least some of the second plurality of photon conversion particles.

2. The photon conversion assembly of claim 1, wherein the first plasmonic near-field enhancement material comprises nanoparticles that have a near-field enhancement in the first received band.

3. The photon conversion assembly of claim 2, wherein the second plasmonic near-field enhancement material comprises nanoparticles that have a near-field enhancement in the second received band.

4. The photon conversion assembly of claim 3, wherein the nanoparticles that have the near-field enhancement in the first received band have a first shape that causes the near-field enhancement in the first received band.

5. The photon conversion assembly of claim 4, wherein the nanoparticles that have the near-field enhancement in the second received band have a second shape that causes the near-field enhancement in the second received band.

6. The photon conversion assembly of claim 5, wherein the first shape is a different shape than the second shape.

7. The photon conversion assembly of claim 3 wherein the nanoparticles that have the near-field enhancement in the first received band comprise a material that causes the near-field enhancement in the first received band.

8. The photon conversion assembly of claim 7 wherein the nanoparticles that have the near-field enhancement in the second received band comprise a material that causes the near-field enhancement in the second received band.

9. The photon conversion assembly of claim 1, comprising:
   a near-field enhancement mesh having a first side and a second side, the near-field enhancement mesh comprising the first plasmonic near-field enhancement material and the second plasmonic near-field enhancement material;
   a photon conversion sheet having a first side and a second side, the photon conversion sheet comprising the first plurality of photon conversion materials and the second plurality of photon conversion materials; and
   wherein the second side of the near-field enhancement mesh abuts the first side of the photon conversion sheet.

10. The photon conversion assembly of claim 9, wherein the near-field enhancement mesh comprises a plurality of cells, each cell of the plurality of cells having one of at least two different configurations, one of the at least two different configurations comprising the first plasmonic near-field enhancement material and another of the at least two different configurations comprising the second plasmonic near-field enhancement material.

11. The photon conversion assembly of claim 1, wherein the first plasmonic near-field enhancement material comprises one of a semiconductor, ruthenium, rhodium, palladium, silver, osmium, iridium, platinum, and gold.

12. The photon conversion assembly of claim 1, wherein the first received band comprises a first range of photon wavelengths and the first converted band comprises a second range of photon wavelengths that are a shorter wavelength than the first range of photon wavelengths.

13. The photon conversion assembly of claim 1, wherein the second received band comprises a third range of photon wavelengths and the second converted band comprises a fourth range of photon wavelengths that are a longer wavelength than the third range of photon wavelengths.

14. A photon conversion assembly, comprising:
a photon conversion layer having a first side and second side, the photon conversion layer comprising a first plurality of photon conversion particles configured to convert photons in a first received band to photons in a first converted band and a second plurality of photon conversion particles configured to convert photons in a second received band to photons in a second converted band; and
a plasmonic near-field enhancement mesh layer positioned adjacent to the photon conversion layer, comprising:
a first plurality of cells having a first configuration that generates a first near-field enhancement that enhances an attraction of photons in the first received band; and
a second plurality of cells having a second configuration that generates a second near-field enhancement that enhances an attraction of photons in the second received band.

15. The multiple-layer photon conversion assembly of claim 14, wherein the first configuration comprises a plurality of edges that form an opening having a first area size, the second configuration comprises a plurality of edges that form an opening having a second area size, wherein the second area size differs from the first area size.

16. The multiple-layer photon conversion assembly of claim 14, wherein the first configuration comprises a border that forms an opening having a first shape, the second configuration comprises a border that forms an opening having a second shape, wherein the second shape differs from the first shape.

17. A photon conversion assembly, comprising:
a first planar near-field enhancement mesh layer comprising a plurality of cells having different configurations, one configuration comprising a first near-field enhancement configuration configured to enhance an attraction of photons in a first received band, another configuration comprising a second near-field enhancement configuration configured to enhance an attraction of photons in a second received band; and
a first photon conversion layer abutting the first near-field enhancement mesh layer, the first photon conversion layer comprising a first photon conversion material configured to convert photons in the first received band to photons in a first converted band and a second photon conversion material configured to convert photons in the second received band to photons in a second converted band.

18. The photon conversion assembly of claim 17, comprising:
a second near-field enhancement mesh layer comprising the plurality of cells having the different configurations abutting the first photon conversion layer; and a second photon conversion layer abutting the second near-field enhancement mesh layer.

19. The photon conversion assembly of claim 17, wherein the first near-field enhancement mesh layer comprises one of a semiconductor, ruthenium, rhodium, palladium, silver, osmium, iridium, platinum, and gold.

* * * * *